United States Patent
Azar

(12) 
(10) Patent No.: US 6,452,799 B1
(45) Date of Patent: Sep. 17, 2002

(54) INTEGRATED CIRCUIT COOLING SYSTEM

(75) Inventor: Kaveh Azar, Westwood, MA (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/662,423

(22) Filed: Sep. 15, 2000

(51) Int. Cl.$^7$ .................................................. H05K 7/20

(52) U.S. Cl. ..................... 361/700; 62/259.2; 165/80.4; 165/104.33; 174/15.2; 361/701; 361/704; 361/707; 361/719; 361/720; 361/715

(58) Field of Search ......................... 62/259.2; 165/80.2, 165/80.3, 80.4, 185, 104.33; 174/15.1, 16.3; 257/706–707, 712–715; 361/688–689, 690, 694–699, 700, 702, 704, 707–711, 790, 715, 719–721

(56) References Cited

U.S. PATENT DOCUMENTS

| | | | | |
|---|---|---|---|---|
| 4,366,526 A | * | 12/1982 | Lijoi et al. ................... | 361/700 |
| 4,916,575 A | * | 4/1990 | Van Asten ................... | 361/707 |
| 5,276,587 A | * | 1/1994 | Ciaccio ....................... | 361/707 |
| 5,424,916 A | * | 6/1995 | Wartin ......................... | 361/699 |
| 5,748,452 A | * | 5/1998 | Londa ......................... | 361/790 |
| 6,158,323 A | * | 12/2000 | Tsuji et al. .................. | 361/699 |

* cited by examiner

Primary Examiner—Gregory Thompson
(74) Attorney, Agent, or Firm—Troutman, Sanders, Mays & Valentine

(57) ABSTRACT

A integrated circuit cooling system includes a thermally conductive element sandwiched between two integrated circuits. The thermally conductive element of this thermal sandwich conducts heat away from both of the attached integrated circuits. The thermally conductive element may be a solid slab of thermally conductive material, such as copper, it may be a hollow, substantially planar thermal conductor with an internally circulating cooling fluid, or it may be a substantially planar heat pipe for example.

14 Claims, 3 Drawing Sheets

INTEGRATED CIRCUIT COOLING SYSTEM

FIELD OF THE INVENTION

The invention relates to the cooling of integrated circuits and, in particular, to the cooling of "stacked" integrated circuits.

BACKGROUND OF THE INVENTION

The speed of electronic components steadily accelerates and, at the same time, increase in density. Additionally, more components are often placed within a single housing than ever before. All these factors: increased speed of operation, increased density of circuitry within a component, and the increased density of components within a housing, contribute to higher operating temperatures. As the temperature of electronic components increase, their reliability decreases. Heat equals failure; and it must be dissipated in order to ensure the proper operation of systems that employ electronic components. Various approaches to the cooling of electronic components have been pursued. Forced fluid cooling is described, for example in, U.S. Pat. No. 4,851,965 issued to Garbuzda et al (Garbuzda), which is hereby incorporated by reference. Garbuzda describes the use of jet impingement of air onto the heat generating component through separate plenums. A circuit pack with inboard jet cooling is described in U.S. Pat. No. 5,067,047 issued to Azar, which is hereby incorporated by reference. It has also been suggested that air can be blown onto the components through holes in the enclosures or shields surrounding the circuit components (see, for example, U.S. Pat. No. 4,393,437 issued to Bell et al and U.S. Pat. No. 4,408,255 issued to Adkins, both of which are hereby incorporated by reference. It has been suggested that holes in the circuit boards themselves could allow air to impinge on components in circuit packs which are stacked (see, for example, U.S. Pat. No. 4,399,484 issued to Mayer, which is hereby incorporated by reference).

Although effective in some ways, each of thee approaches has its own limitations. An electronic cooling system that provides efficient and substantial cooling potential for integrated circuits, particularly for integrated circuits that are "stacked" in order to further increase circuit density, would be highly desirable.

SUMMARY

An integrated circuit cooling system in accordance with the principles of the present invention includes a "filling" of thermally conductive material sandwiched between two integrated circuit dies. The term "thermally conductive material" is used herein to include a variety of materials, such as copper, aluminum, copper alloys, and other materials known in the art. The thermally conductive element of this thermal sandwich conducts heat away from both of the attached integrated circuits. The thermally conductive element may be a solid slab of thermally conductive material, such as copper, it may be a hollow, substantially planar thermal conductor with an internally circulating cooling fluid, or it may be a substantially planar heat pipe, for example. The integrated circuits attached to either side of the thermally conductive element may be housed in chip carriers or other known integrated circuit packaging. In one aspect of the invention the integrated circuit "chip" or "die" of each integrated circuit is held in closest proximity to the thermal conductor. Dielectric material may be placed on the surfaces of the thermally conductive element that make contact with the integrated circuits in order to prevent any possible shorting of the circuits included within the integrated circuits. A "thermal grease" may be employed to form a good thermally conductive interface between the thermally conductive element and at least one of the attached integrated circuits.

BRIEF DESCRIPTION OF THE DRAWINGS

The above and further features, aspects, and advantages of the invention will be apparent to those skilled in the art from the following detailed description, taken together with the accompanying drawings in which.

DETAIL DESCRIPTION

Figure 1:
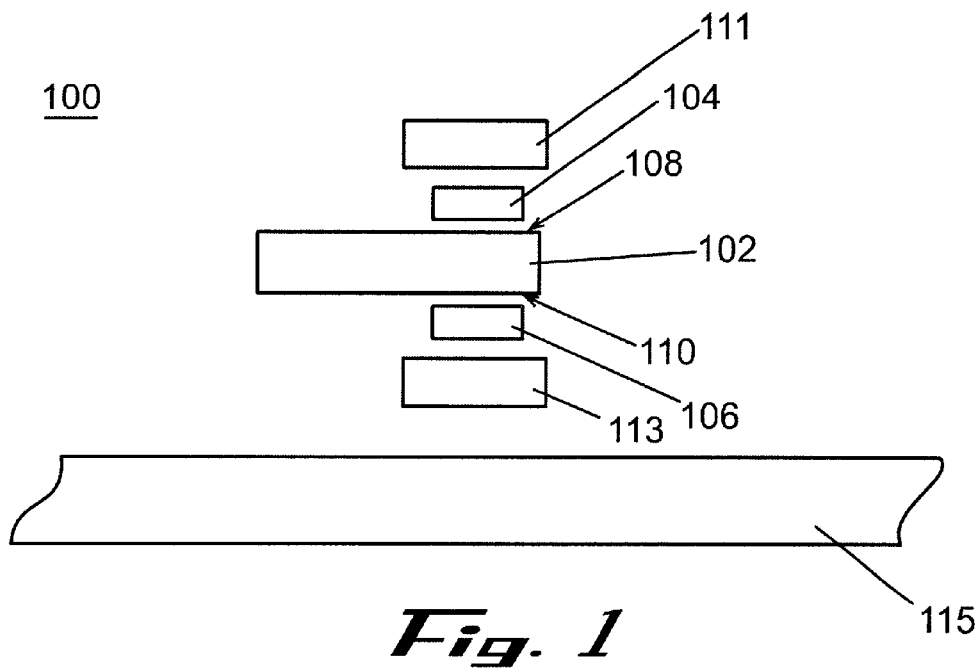
FIG. 1 is a front exploded view of an integrated circuit cooling system in accordance with the principles of the present invention.

The front exploded view of FIG. 1 of an illustrative embodiment of a integrated circuit cooling system 100 in accordance with the principles of the present invention includes a substantially planar thermally conductive element 102 and first 104 and second 106 integrated circuits. As indicated by the arrows, the first 104 and second 106 integrated circuits are attached, respectively, to the first 108 and second 110 sides of the cooling element 102. Attachment may be through various means, such as adhesives, or spring clips, for example. The thermally conductive element 102 conducts heat away from the attached integrated circuit 104 and integrated circuit 106. The integrated circuit "chips", or "dies", may be housed using known packaging systems, such as chip carriers 111 and 113. The thermally conductive element 102 may be a solid slab of high thermal conductivity material (that is, having a thermal conductivity of at least 40 Wmk) such as copper or a copper alloy, for example, it may be a hollow, substantially planar thermal conductor with an internally circulating cooling fluid (with the circulating fluid circulating "outside" the body of the thermal conductor to dissipate heat), or it may be a substantially planar heat pipe, for example. Heat pipes are known in the art and are discussed, for example in U.S. Pat. No. 6,055,157 issued to Bartilson, and U.S. Pat. No. 4,921,041, issued to Akachi, which are hereby incorporated by reference.

The thermally conductive element 102 may be coated on those sides 108 and 110 that make thermal contact with the integrated circuits 104 and 106, respectively, with a dielectric material, such as a glass epoxy available from Chomerics Inc. of Woburn, Mass. that, although a poor electrical conductor, is a good thermal conductor. A "thermal grease", or gap filler available from Chomerics Inc., of Woburn Mass., may be applied to sides 108 and 110 to enhance the thermal transfer between the thermally conductive element and attached first 104 and second 106 integrated circuits. The integrated circuit cooling system 100 may be electrically interconnected with other electronics through a printed circuit board 115 upon which it may be mounted.

Figure 2:
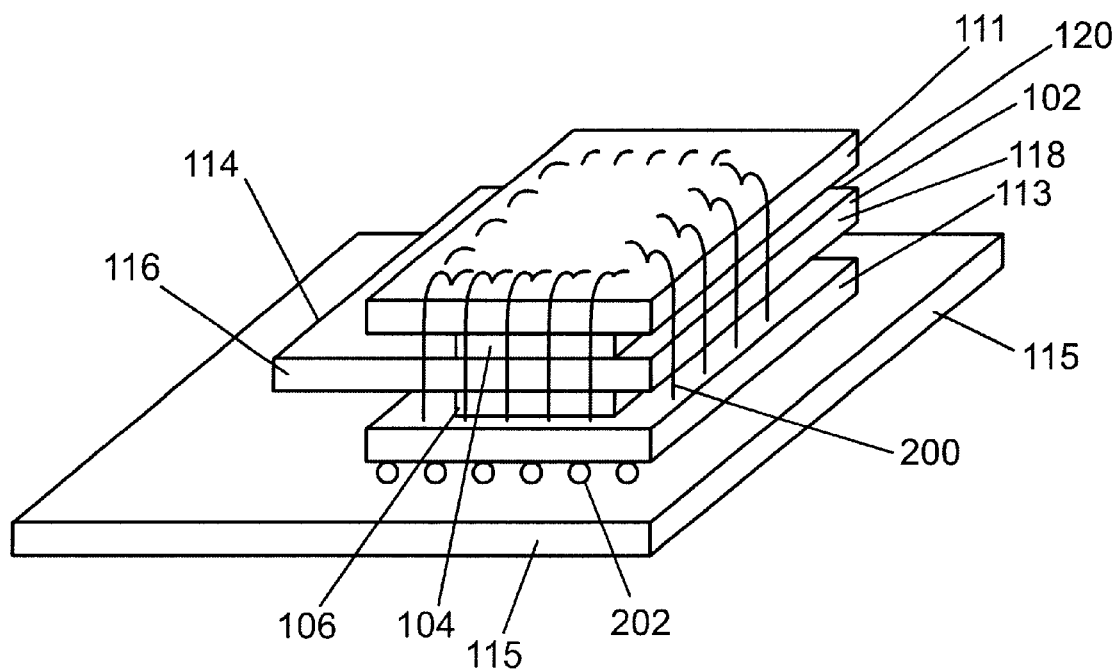
FIG. 2 is a perspective view of an integrated circuit cooling system in accordance with the principles of the present invention.

The perspective view of FIG. 2 illustrates an embodiment of the invention in which the thermally conductive element 102 extends beyond the outlines of the attached integrated circuit 104 and integrated circuit 106. By extending beyond integrated circuit 104 and integrated circuit 106 in this manner, the conductive element may make direct contact with a heat sink. The heat sink, not shown, may be the card cage in which the integrated circuits 104 and 106 are housed, or a heat sink located on a circuit board 115 upon which the integrated circuits are located, thereby providing a path for thermal conduction away from the integrated circuits 104 and 106 toward. The areas of contact between the thermally conductive element and heat sink may be coated with a thermally conductive grease to enhance thermal transfer. After accepting thermal energy from a integrated circuit, the thermally conductive element 102 may transfer such energy through any surface, including edge surfaces 114, 116, 118, or 120, in addition to other surface areas that may not be covered by the integrated circuits 104 and 106. Such thermal transfer may be a direct, conductive transfer through contact with a heat sink for example, or it may be a convective, or radiant transfer, which may be accelerated through known means, such as fans or heat exchangers.

Although channels may be formed within the thermally conductive element 102 to permit the electrical connection of the integrated circuit 104 to circuits on the printed circuit board 115 connection from the integrated circuit 104 farther from the printed circuit board (with an intervening thermally conductive element 102) may be made through conductors 200 "wirebound" to pads on the chip carrier 111. The conductors 200 may connect the circuits of integrated circuit 104 from the chip carrier 111 to the chip carrier 113 and, through the chip carrier's connection points 202, to the printed circuit board 115 to which the system 100 is attached. The conductors 200 may be organized in a known interconnection mechanism, such as a ribbon cable, in order to permit the thermally conductive element 102 to extend beyond the outline of the integrated circuits (and related packaging such as chip carriers 111 and 113) on one or more sides without interference from the conductors 200.

Figure 3:
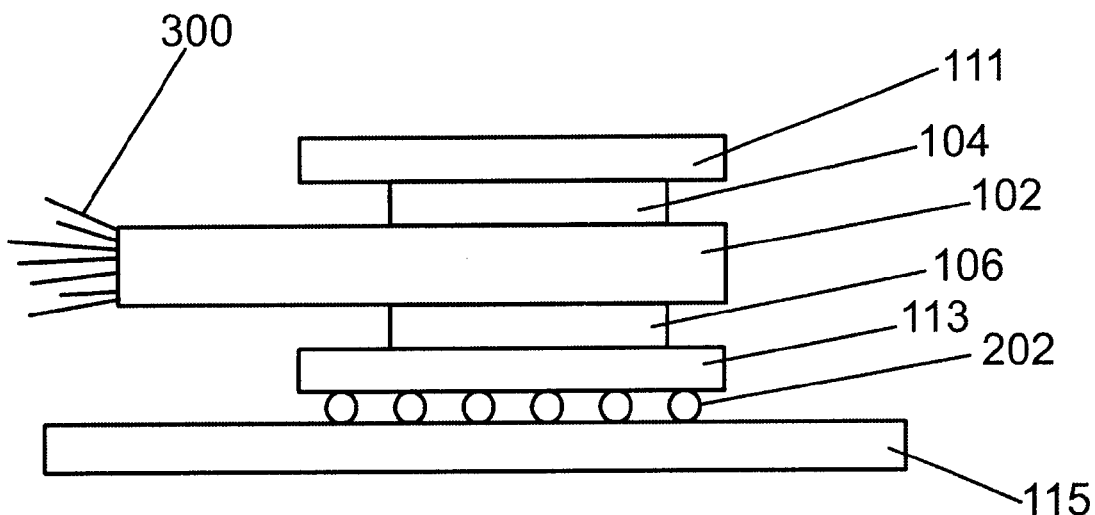
FIG. 3 is an elevation view of an integrated circuit cooling system in accordance with the principles of the present invention that includes a heat exchanger.

FIG. 3 provides an elevation view of an integrated circuit cooling system in accordance with the principles of the present invention in which the thermally conductive element 102 is sandwiched between first 104 and second 106 integrated circuits. The thermally conductive element 102 conducts heat away from the attached integrated circuit 104 and integrated circuit 106. The integrate circuit dies 104 and 106 are housed in chip carriers 111 and 113 and are in electrical communication with circuits located on the printed circuit board 115 to which the system 100 is attached. In this illustrative embodiment the thermally conductive element includes a heat exchanger 300 located on the portion of the conductive element 102 which extends beyond the perimeter of the chip carrier/integrated circuit combinations (111/104, 113/106). The heat exchanger 300 accelerates the dissipation of heat conducted from the integrated circuits 104 and 106, thereby permitting the circuits to operate at a lower, less stressful temperature.

Figure 4:
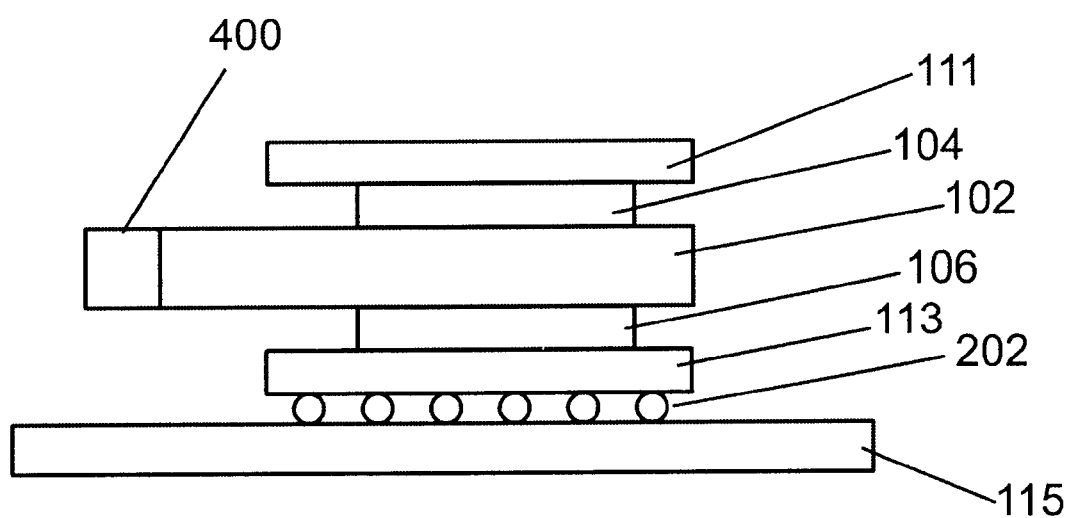
FIG. 4 is an elevation view of an integrated circuit cooling system in accordance with the principles of the present invention that includes a thermal-electric cooler.

FIG. 4 provides an elevation view of an integrated circuit cooling system in accordance with the principles of the present invention in which the thermally conductive element 102 is sandwiched between first 104 and second 106 integrated circuits. The thermally conductive element 102 conducts heat away from the attached integrated circuit 104 and integrated circuit 106. The integrate circuit dies 104 and 106 are housed in chip carriers 111 and 113 and are in electrical communication with circuits located on the printed circuit board 115 to which the system 100 is attached. In this illustrative embodiment the thermally conductive element includes a thermal-electric cooler 400 located on the portion of the conductive element 102 which extends beyond the perimeter of the chip carrier/integrated circuit combinations (111/104, 113/106). The thermal-electric cooler 400 accelerates the dissipation of heat conducted from the integrated circuits 104 and 106.

Figure 5:
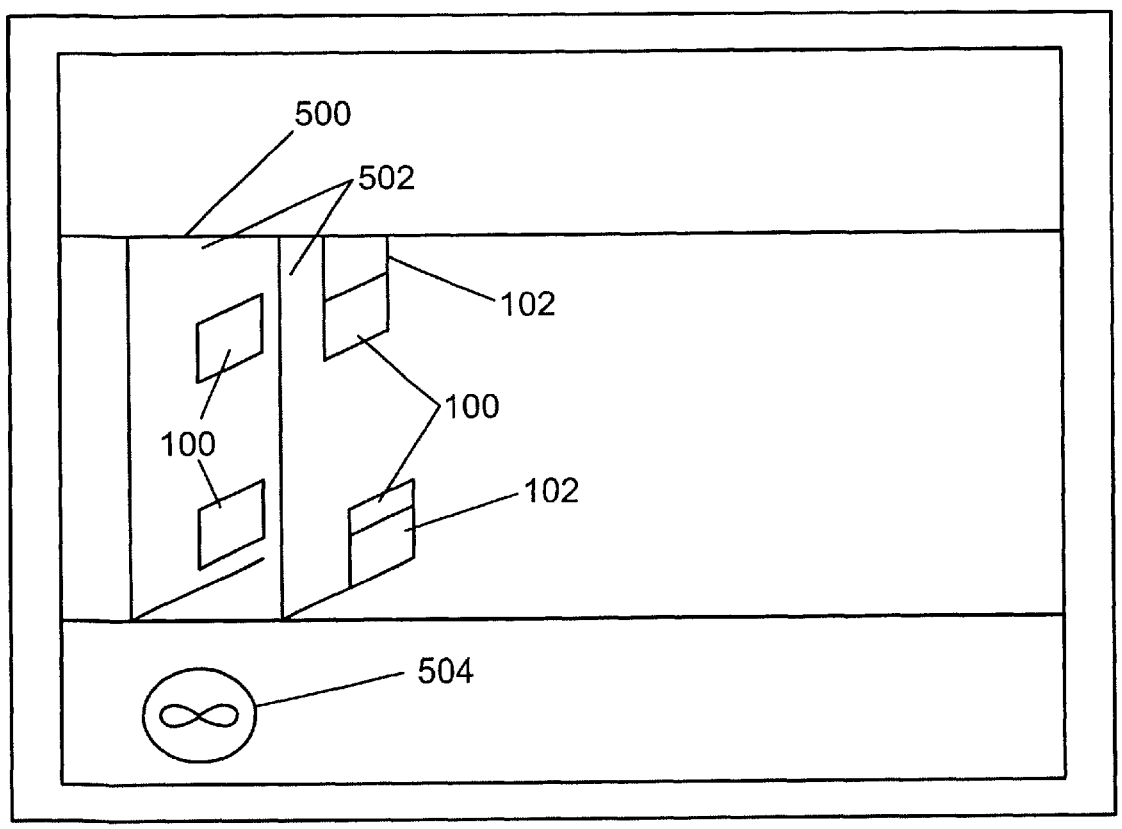
FIG. 5 is a perspective view of an electronics cabinet that includes one or more integrated circuit cooling systems in accordance with the principles of the present invention.

The perspective view of FIG. 5 illustrates a card cage 500 that houses circuit boards 502 upon which integrated circuit cooling systems 100 in accordance with the principles of the present invention are mounted. The card cage may be a thermally enhanced cage, composed of a high thermal conductivity material, for example. A fluid mover, such as a fan 504, may be employed to further dissipate heat generated by integrated circuits 104 and 106.

The foregoing description of specific embodiments of the invention has been presented for the purposes of illustration and description. It is not intended to be exhaustive or to limit the invention to the precise forms disclosed, and many modifications and variations are possible in light of the above teachings. The embodiments were chosen and described to best explain the principles of the invention and its practical application, and to thereby enable others skilled in the art to best utilize the invention. It is intended that the scope of the invention be limited only by the claims appended hereto.

What is claimed is:

1. An integrated circuit cooling system comprising:
    a substantially planar heat pipe having first and second substantially planar sides;
    a first integrated circuit attached to the first side of said heat pipe;
    a first chip carrier housing said first integrated circuit, said first chip carrier located on an opposite side of said first integrated circuit from said heat pipe;
    a second integrated circuit attached to the second side of said heat pipe;
    a second chip carrier housing said second integrated circuit, said second chip carrier located on an opposite side of said second integrated circuit from said heat pipe;
    wherein a first end portion of said heat pipe extends beyond the perimeter of said attached integrated circuits and a second end portion of said heat pipe is within the perimeter; and
    electrical conductors extending from one chip carrier to the other chip carrier around said second end portion of said heat pipe such that circuits from one chip carrier are connected to the other chip carrier through the electrical conductors.

2. The cooling system of claim 1 further comprising a thermal electric cooler attached to the first end portion of said heat pipe.

3. The cooling system of claim 1 further comprising a heat exchanger attached to said first end portion of said heat pipe.

4. The cooling system of claim 1 further comprising a dielectric material between the surface of said heat pipe and at least one of said integrated circuits.

5. The cooling system of claim 1 further comprising a thermal grease between the surface of said heat pipe and at least one of said integrated circuits.

6. A integrated circuit cooling system comprising:
    a thermally conductive card cage for receiving integrated circuits; and a integrated circuit pack inside the card cage and in thermally conductive communication with the card cage, the integrated circuit pack including:

a substantially thermally conductive element having first and second substantially planar sides;

a first integrated circuit attached to the first side of said thermally conductive element;

a first chip carrier housing said first integrated circuit, said first chip carrier located on an opposite side of said first integrated circuit from said thermally conductive element;

a second integrated circuit attached to the second side of said thermally conductive element;

a second chip carrier housing said second integrated circuit, said second chip carrier located on an opposite side of said second integrated circuit from said thermally conductive element;

wherein a first end portion of said thermally conductive element extends beyond the perimeter of said attached integrated circuits and a second end portion of said thermal element is within the perimeter; and at least one conductor extending from said first chip carrier to said second chip carrier around said second end portion of said thermally conductive element, wherein said first portion of said thermally conductive element is in thermal conductive communication with the card cage.

7. The cooling system of claim 6 further comprising a thermal electric cooler attached to the extended portion of said heat pipe.

8. The cooling system of claim 6 further comprising a heat exchanger attached to said extended portion of said heat pipe.

9. The cooling system of claim 6 further comprising a printed circuit board attached to one of said integrated circuits.

10. The circuit stack of claim 9 further comprising a heat sink attached to said circuit board, wherein said heat sink is in thermal connection with said thermally conductive element.

11. An integrated circuit stack comprising:

a substantially planar thermally conductive element having first and second planar sides;

a first integrated circuit attached to the first planar side of the thermally conductive element;

a printed circuit board;

a second integrated circuit attached to the second planar side of the thermally conductive element and located between said printed circuit board and said thermally conductive element;

a first chip carrier housing said first integrated circuit, said first chip carrier located on a side of said first integrated circuit opposite said thermally conductive element;

a second chip carrier housing said second integrated circuit said second chip carrier located on a side of said second integrated circuit opposite said thermally conductive element, said second chip carrier electrically connected to said printed circuit board; and conductors extending from said first chip carrier to said second chip carrier, such that said first integrated circuit and said second integrated circuit are electrically connected to said printed circuit board, wherein an extended end portion of said thermally conductive element extends beyond the perimeter of the attached integrated circuits and said conductors extend around said thermally conductive element at a second end portion.

12. The circuit stack of claim 11 further comprising a thermal electric cooler attached to the extended portion of said heat pipe.

13. The circuit stack of claim 11 further comprising a heat exchanger attached to said extended portion of said heat pipe.

14. The circuit stack of claim 11 further comprising a heat sink, said heat sink attached to said printed circuit board, wherein said thermally conductive element is in thermal connection with said heat sink.

* * * * *